United States Patent
Paul et al.

(10) Patent No.: US 9,337,952 B2
(45) Date of Patent: May 10, 2016

(54) EMBEDDED RESILIENT BUFFER

(71) Applicants: Somnath Paul, Hillsboro, OR (US); Sriram R. Vangal, Portland, OR (US)

(72) Inventors: Somnath Paul, Hillsboro, OR (US); Sriram R. Vangal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 282 days.

(21) Appl. No.: 13/867,968

(22) Filed: Apr. 22, 2013

(65) Prior Publication Data

US 2014/0317458 A1 Oct. 23, 2014

(51) Int. Cl.

| | |
|---|---|
| H04L 1/00 | (2006.01) |
| H03K 19/00 | (2006.01) |
| G06F 11/26 | (2006.01) |
| G11C 29/00 | (2006.01) |
| G11C 29/02 | (2006.01) |
| G06F 13/16 | (2006.01) |
| H04L 12/70 | (2013.01) |

(52) U.S. Cl.
CPC H04L 1/00 (2013.01); G06F 11/26 (2013.01); G11C 29/003 (2013.01); G11C 29/023 (2013.01); G11C 29/028 (2013.01); H03K 19/00 (2013.01); G06F 13/1689 (2013.01); H04L 2012/5681 (2013.01)

(58) Field of Classification Search
CPC .............. H04L 2012/5681; G06F 5/06; G06F 13/1689
See application file for complete search history.

(56) References Cited

U.S. PATENT DOCUMENTS

| | | | | |
|---|---|---|---|---|
| 5,469,449 | A * | 11/1995 | Park ............................... | 714/767 |
| 8,301,970 | B2 * | 10/2012 | Bowman et al. .............. | 714/758 |
| 2013/0193999 | A1 * | 8/2013 | Turnquist et al. .............. | 326/10 |
| 2014/0122947 | A1 * | 5/2014 | Bowman et al. .............. | 714/700 |

* cited by examiner

*Primary Examiner* — M. Mujtaba K Chaudry
(74) *Attorney, Agent, or Firm* — Blakely, Sokoloff, Taylor & Zafman LLP

(57) ABSTRACT

Described is an apparatus that comprises: a first sequential unit; a first queue coupled in parallel to the first sequential unit such that the first queue and first sequential unit receive a first input, the first sequential for double sampling the first input; a compare unit to receive an output from the first sequential unit; and a first selection unit controllable by a write pointer of a previous cycle, the first selection unit to receive outputs of each storage unit of the first queue, wherein the first selection unit to generate an output for comparison by the first compare unit.

12 Claims, 6 Drawing Sheets

EMBEDDED RESILIENT BUFFER

BACKGROUND

FIFO (First In, First Out) or "Queues" are vital components used for buffering and flow control in digital designs. A FIFO typically has storage (e.g., data-path) and associated read and write pointers (control logic). Low-voltage operation through reduction of minimum voltage of operation ($V_{MIN}$) is an effective approach to reduce power in digital designs. At low supply voltages, logic paths writing to FIFO buffers are susceptible to dynamic variations such as voltage droops or temperature changes which can lead to timing failures. Tolerance to fast transients may be needed to maintain robust FIFO buffer operation.

FIG. 1 shows a conventional implementation 100 of a FIFO, enhanced with error detection sequentials (EDS) at the input to protect FIFO writes, providing dynamic variation tolerance. Implementation 100 consists of a master-slave flip-flop (MSFF) 101 coupled to a latch 102, an XOR gate 103, and a FIFO 104. In this implementation, FIFO 104 is connected in series to the sampling latch 102 such that output Fifo_in of latch 102 is received by FIFO 104. MSFF 101 is used for double sampling of input data 'D.' The outputs of MSFF 101 and latch 102 are compared by XOR 103 to determine whether the outputs differ. If the outputs differ, the XOR 103 asserts an Error signal. This conventional implementation 100, however, adds a cycle of latency.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
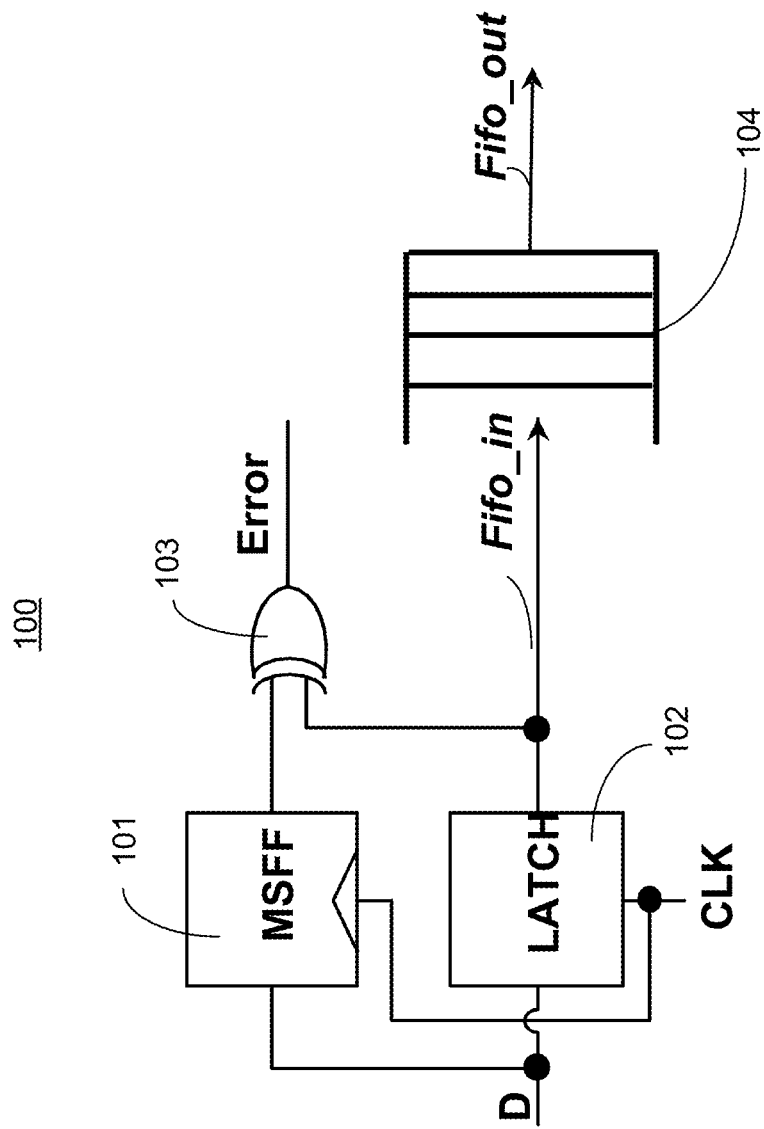
FIG. 1 is a conventional implementation of a First In, First Out (FIFO) with a sequential unit for timing error detection.

Interconnection architectures, for example, in a network-on-chip (NoC) of a system-on-chip (SoC), rely on routers to manage messaging traffic between nodes (e.g., processor cores, memory). These routers consume power to operate and may contribute significantly to the overall power consumption for a SoC. One strategy for reducing power consumption is to reduce operating voltages. However, at low voltages the routers are prone to dynamic variations such as voltage droops or aging effects, which can potentially lead to timing failures in the router. Robustness of operation is typically ensured by use of a static voltage guard band selected at design time. Use of a static voltage guard band requires a higher operating voltage and increases power consumption.

The embodiments also relate to resilient communication techniques that may be utilized to provide reliable, efficient communication of messages.

In one embodiment, dynamic variations that manifest as timing failures in a router are detected using Error Detection Sequential (EDS) mechanisms that can be hardware circuitry. In one embodiment, resilient router architecture includes EDS in a processing stage that can operate to protect timing paths within the router. Correction of messages exposed to timing failures inside the router can be accomplished utilizing packet replay techniques.

In one embodiment, the EDS scheme provides native protection against soft-error (SER) induced events due to double-sampling. In addition, the disclosed scheme can protect against SER related combinational delay push-outs and sequential state loss.

In one embodiment, a router (or other component) includes a resiliency-enhanced final stage that operates to protect timing paths within the router. For example, a router having EDS mechanisms operates to protect all timing paths in the router that originates from an output (e.g., FIFO) queue. In one embodiment, correction of packet (or message, or flit) errors based on timing failures within the router (or other component) is accomplished via packet replay techniques.

Because the timing failure at the output stage is determined after a message has been transmitted to the receiving node (e.g., router, traffic generator), an error signal (e.g., bit, flag, etc.) is transmitted with the message to indicate whether a timing failure has occurred, according to one embodiment. Because the error signal may be meta-stable, it is latched in the input stage of the receiving node before consumption, according to one embodiment. In one embodiment, the error signal operates as an invalidation signal to cause the corresponding message to be squashed (or otherwise not consumed or used) by the receiving node.

In one embodiment, the transmitting node (e.g., router) that suffered from the timing failure replays the failed message by rolling back its state by the necessary number of clock cycles (e.g., to a checkpoint). In one embodiment, two clock cycles is sufficient. In alternate embodiments, a greater rollback range may be supported. In one embodiment, this can be accomplished by isolating the control and data path for the transmitting node and keeping copies for critical data and control state elements (e.g., via flip-flop or latch) in the transmitting node.

In one embodiment, an output queue (e.g., a FIFO or other type of output queue) has enough unused space during normal operation that messages from previous cycles are still present and not overwritten before they are used for retransmission when necessary. In another embodiment, FIFO depth can be increased to accommodate additional message space for retransmission. For example, in one embodiment, a timing error is determined and the message is retransmitted within two clock cycles. The transmitting node is rolled back to a previous state and the failing message is retransmitted to the receiving node.

In one embodiment, use of positive phase latches in the EDS mechanism may cause the output stage prone to hold time failures. This can be avoided by selectively buffering minimum-delay timing paths to EDS-enhanced stages and feeding a pulsed clock to the output stage. In one embodiment, the output stage receives a configurable pulse width clock signal and other stages receive a 50% duty cycle clock signal. In one embodiment, to reduce the effect of within-die and intra-die variations at very low operating voltages (e.g., near transistor threshold voltage), a pruned standard cell library with upsized sequential and combinational logic states may be used.

The embodiments describe a storage queue with an embedded parallel scheme to enable resilient operation with virtually little or no latency impact. The combination of error detection and recovery circuits with dynamic adaptation enables processors to adapt to operating environment. The embodiments may also protect circuits from malicious attack. For example, if a malicious attack is an errant power virus that results in transient variations (e.g., supply voltage droops, temperature changes, etc.) the embodiments discussed can detect and correct timing errors and improve design robustness.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
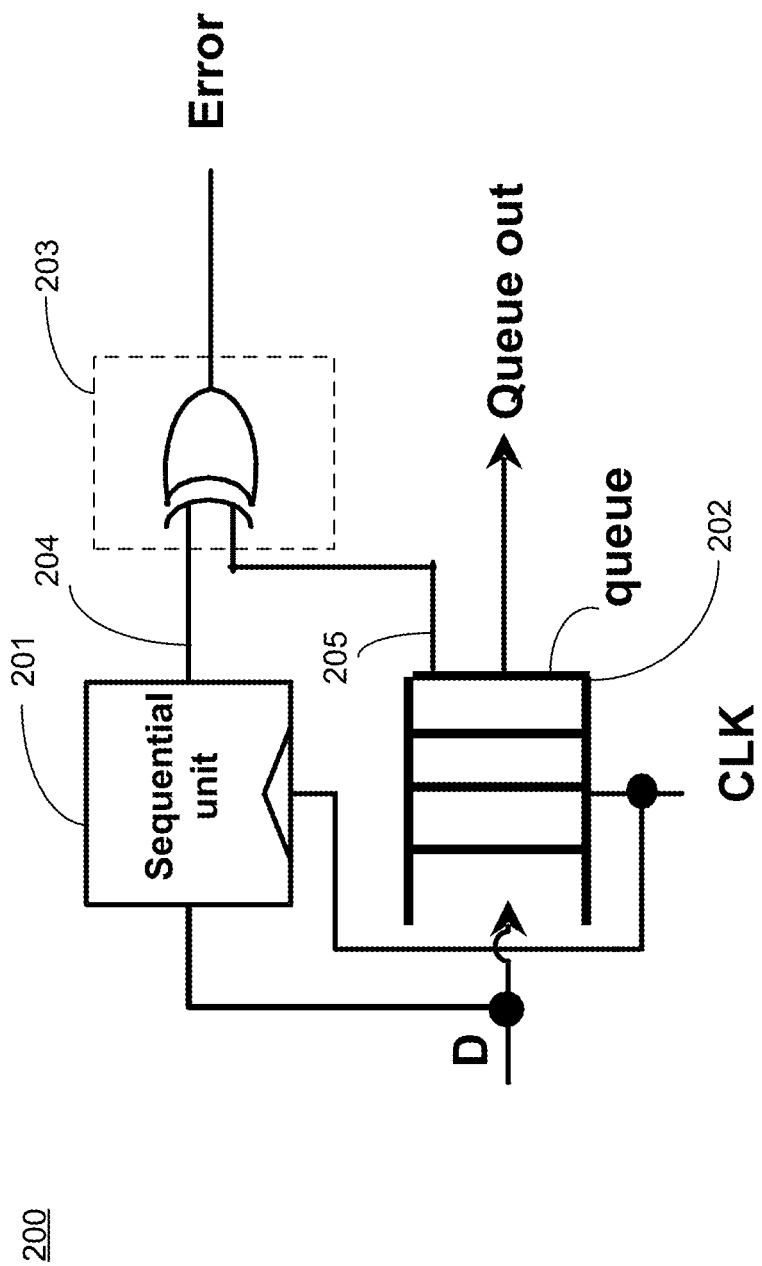
FIG. 2 is a queue embedded in parallel with a sampler, according to one embodiment of the disclosure.

FIG. 2 is a circuit 200 of a queue embedded in parallel with a sampler, according to one embodiment of the disclosure. It is pointed out that those elements of FIG. 2 having the same reference numbers (or names) as the elements of any other figure can operate or function in any manner similar to that described, but are not limited to such.

In one embodiment, circuit 200 comprises a sequential unit 201, a queue 202, and a compare unit 203. In one embodiment, sequential unit 201 is used for sampling input data 'D' which is also received by queue 202. In one embodiment, sequential unit 201 is used for double sampling the input data 'D.' In one embodiment, sequential unit 201 is a flip-flop. In other embodiments, other edge triggered or level sensitive sequential units may be used for sequential unit 201.

In one embodiment, queue 202 is a FIFO queue which receives input 'D' and generates an output "Queue out" after a predefined number of clock (CLK) cycles. In one embodiment, queue 202 comprises series coupled SRAM cells (Static Random Access Memory). In one embodiment, queue 202 comprises a shift-register chain. In one embodiment, queue 202 comprises a chain of flip-flops and/or latches. In other embodiments, other storage (and/or sequential) units may be used for form queue 202. In one embodiment, length of queue 202 is at least three storage units. For example, if queue 202 is a FIFO, then the FIFO has three storage units coupled together in series.

In one embodiment, output 204 of sequential unit 201 and output 205 of queue 202 is compared by compare unit 203. In one embodiment, output of compare unit 203 is an ERROR signal. In one embodiment, compare unit 203 comprises an XOR logic gate. In other embodiments, other circuits may be used to compare outputs 204 and 205 to generate the ERROR signal. The embodiment of FIG. 2 forms an embedded resilient buffer or sequential (EDS) which is faster than the EDS of FIG. 1, and its parallel architecture allows for resilient operation with virtually no (or substantially zero) latency impact.

Figure 3:
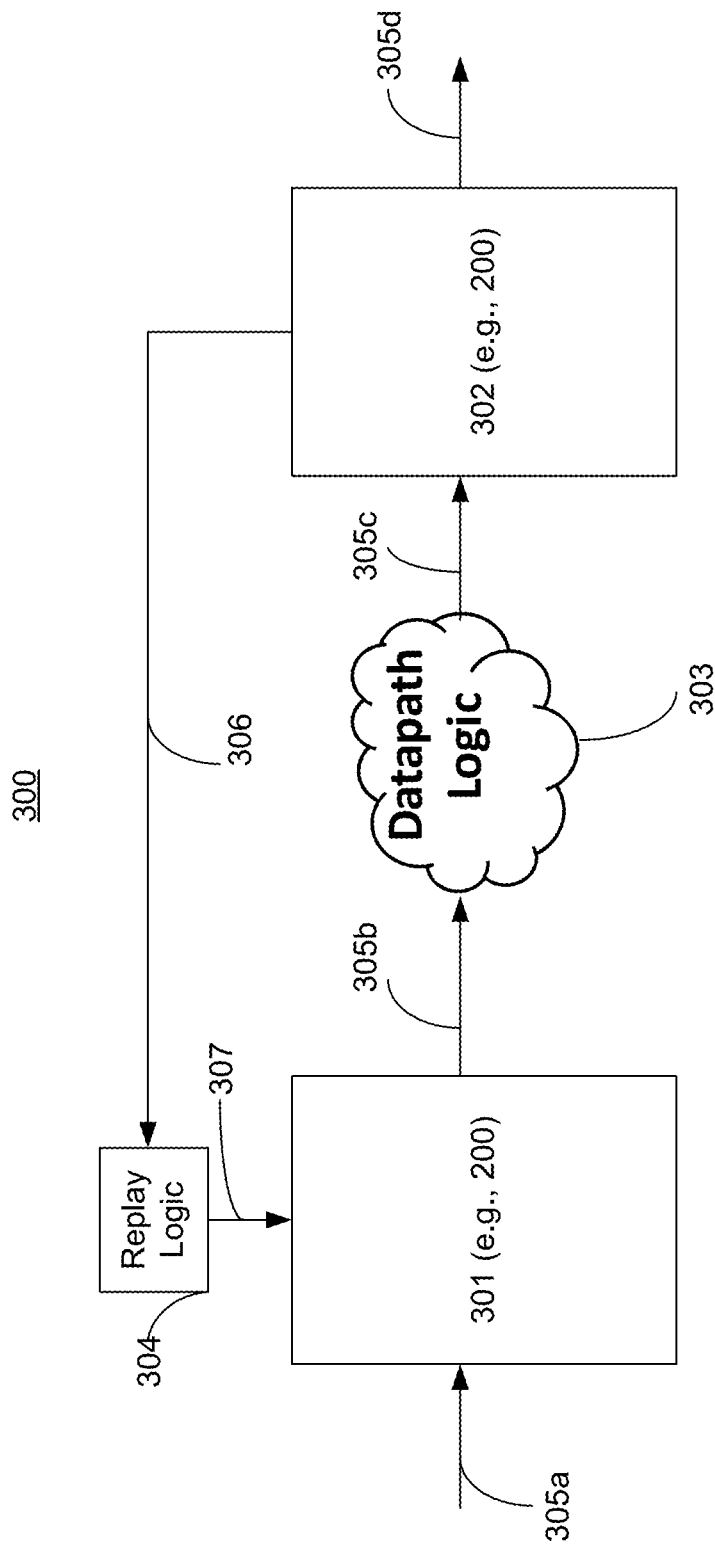
FIG. 3 is a pipeline with queue embedded in parallel with the sampler, and with error detection and recovery, according to one embodiment of the disclosure.

FIG. 3 is a pipeline 300 with queue embedded in parallel with the sampler, and with error detection and recovery, according to one embodiment of the disclosure. It is pointed out that those elements of FIG. 3 having the same reference numbers (or names) as the elements of any other figure can operate or function in any manner similar to that described, but are not limited to such.

In one embodiment, pipeline 300 comprises first EDS 301, second EDS 302, data-path logic 303, and replay logic 304. In one embodiment, first and second EDSs (301 and 302) have the same architecture of 200 shown in FIG. 2. While FIG. 2 shows a high level design of an EDS, further details of the EDS architecture are discussed with reference to FIGS. 4-5.

Referring back to FIG. 3, in one embodiment, first EDS 301 receives input data 305$a$ and generates a sampled output 305$b$ which is received by data-path logic 303 (e.g., combinational logic). In one embodiment, output 305$c$ of data-path logic 303 is received by second EDS 302 which generates another sampled output 305$d$, where sampled output 305$d$ is sampled off of 305$c$. In one embodiment, ERROR signal (same as 306) from second EDS 302 is received by replay logic 304 that generates an adjusted read pointer signal 307 to cause first EDS 301 to resend data 305$b$ for sampling again by second EDS 302.

Figure 4:
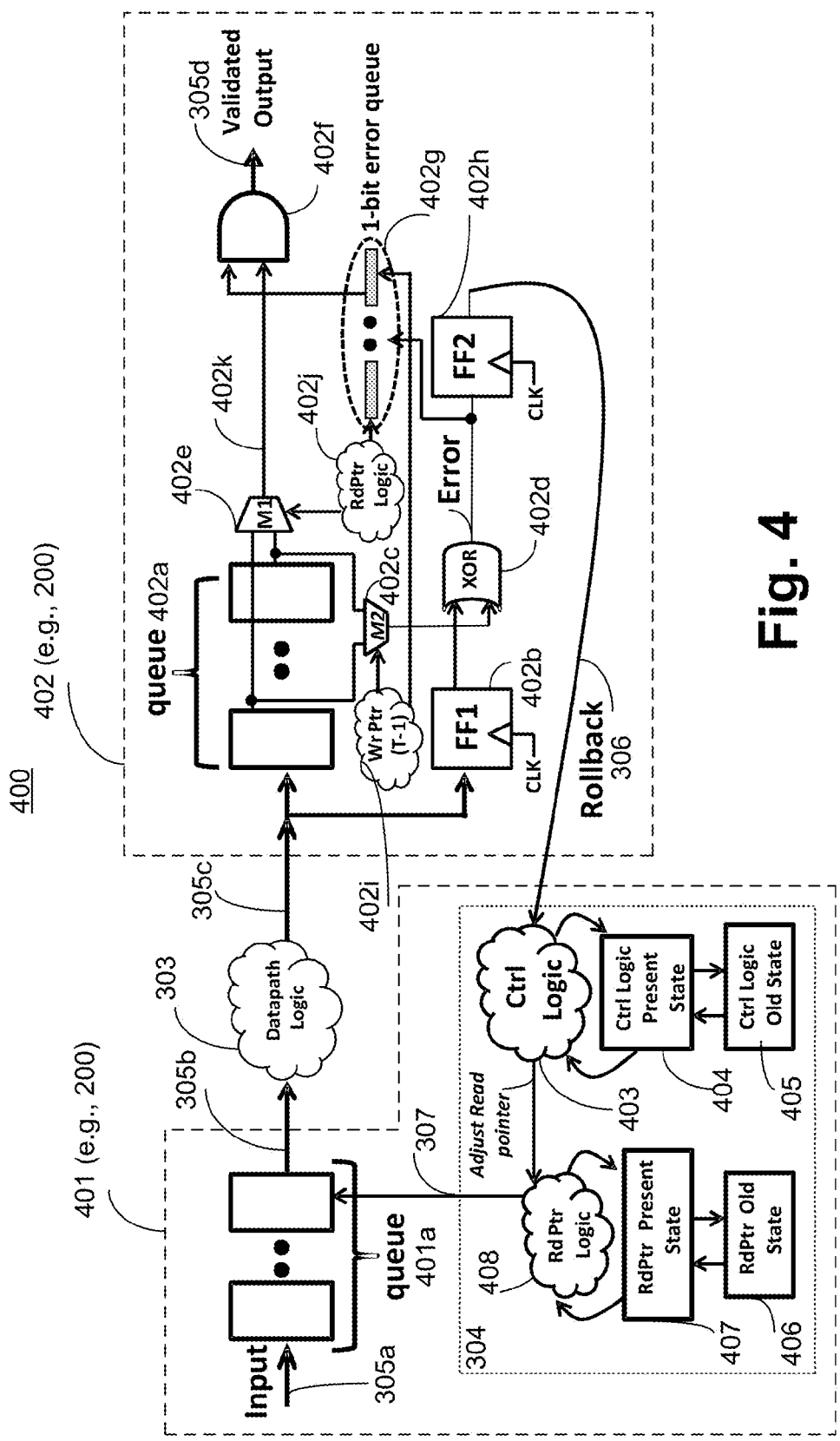
FIG. 4 is a detailed description of the pipeline, according to one embodiment of the disclosure.

FIG. 4 is a detailed circuit 400 of the pipeline 300, according to one embodiment of the disclosure. It is pointed out that those elements of FIG. 4 having the same reference numbers (or names) as the elements of any other figure can operate or function in any manner similar to that described, but are not limited to such.

In one embodiment, circuit 400 is a pipeline comprising first EDS 401, second EDS 402 and data-path 303. So as not to obscure the embodiment of FIG. 4, pertinent components of each EDS is shown and associated logic. In one embodiment, both first and second EDS (401 and 402) have the same architecture i.e., same circuit components.

In one embodiment, first EDS 401 comprises a first queue 401a (e.g., FIFO, shift-register chain, chain of SRAMs, etc.) which receives input 305a and generates an output 305b. In one embodiment, first queue 401a receives a read pointer 307 that points to the storage unit (from among a plurality of storage units of queue 401a) from which data is being read and sent out as 305b. In one embodiment, read pointer 307 is updated by replay logic 304. While the embodiment of FIG. 4 shows replay logic 304 to be part of first EDS 401, replay logic 304 may reside outside the boundary of first EDS 401.

In one embodiment, second EDS 402 comprises first queue 402a (e.g., FIFO, shift-register chain, chain of SRAMs, etc.) which receives input 305c from data-path logic 303. In one embodiment, second EDS 402 comprises an edge triggered sequential unit (FF1) 402b (also referred as first sequential unit) which is coupled to first queue 402a in parallel such that both receive the same input 305c. In one embodiment, second EDS 402 comprises a first selection unit 402c which is operable (via select signal) to select one of the outputs of the storage units of first queue 402a. In one embodiment, first selection unit 402c is a multiplexer (M2) which provides output for compare unit 402d.

In one embodiment, write-pointer (Wr Ptr) logic 402i generates the select signal for first selection unit 402c. In one embodiment, write-pointer logic 402i tracks write operation to first queue 402a. For example, write-pointer logic 402i tracks previous cycle (T−1, where 'T' is the current time) and controls first selection unit 402c to select the exact data in first queue 402a written in cycle (T−1).

In one embodiment, output of first sequential unit (FF1) 402b and first selection unit 402c is received by compare unit 402d. In one embodiment, 402d is an XOR (exclusive-OR gate). In other embodiments, other means for comparing signals may be used. In one embodiment, output of compare unit 402d is Error signal which is used to generate Rollback signal 306. For example, XOR gate (an embodiment of compare unit 402d) compares write data from a storage unit of queue 402b and output of double sampled input data 305c to generate the Error signal on a mismatch. In one embodiment, Error signal is sampled by a second sequential unit (FF2) 402h to generate Rollback signal 306 for Rollback logic 304.

In one embodiment, second EDS 402 comprises a second queue 402g (e.g., FIFO, shift-register chain, chain of SRAMs, etc.). In one embodiment, second queue 402g is coupled to write-pointer logic 402i and compare unit 402d. In one embodiment, second queue 402g is a 1-bit error FIFO which logs the Error signal from compare unit 402d. In one embodiment, the number of storage units in second queue 402g is the same as the number of storage units in first queue 402a. Such an embodiment allows the Error signal to move in "lock step" with the forward data propagation (i.e., read operation of first queue 402a). In one embodiment, output of second queue 402g is received by logic 402f which validates the output.

In one embodiment, second EDS 402 comprises a second selection unit 402e (e.g., multiplexer 402e) which is operable to select output of one of the storage units of first queue 402a. In one embodiment, read-pointer (RdPtr) logic 402j generates the select signal for second selection unit 402e causing second selection unit 402e to generate an output 402k which is the output being read from first queue 402a. In one embodiment, logic 402f (e.g., AND logic gate) performs a logical AND operation on 402a and output of second queue (error queue) to determine whether the output being read from first queue 402a is a valid output. While the embodiment shows logic 402f implemented as an AND logic gate, other logic gates may be used to perform the AND operation (e.g., NAND gate followed by an inverter).

In one embodiment, if it is determined that output 305d from logic 402f indicates a valid output (i.e., an output with no timing failures), then output 402k is passed on to a following circuit e.g., another data-path (not shown). In one embodiment, if it is determined that output 305d from logic 402f is invalid data (i.e. data generated from timing failures) then output 402k is not passed on to a following circuit but is corrected by asking first queue 401a of first EDS 401 to resend the data.

In one embodiment, Error signal from compare unit 402d is generated one clock (CLK) cycle after timing failure event. In such an embodiment, Rollback signal 306 is generated two clock (CLK) cycles after the failure event, and is routed back to the sending EDS (i.e., first EDS 401). In one embodiment, replay logic 304 receives Rollback signal 306 and begins the recovery process. In such an embodiment, timing failure in downstream queue (i.e., first queue 402a of second EDS 402) triggers the recovery process.

In one embodiment, recovery is accomplished by reading/replaying the failing data again from the transmitting queue (e.g. first queue 401a of first EDS 401). In one embodiment, replaying is performed by rolling back the state by two clock (CLK) cycles. Here, the two clock cycles ensure that meta-stability is avoided. However, in other embodiments, other numbers of clock cycles may be used to avoid meta-stability issues.

In one embodiment, replay logic 304 comprises a control (Ctrl) logic 403 that adjusts the position of read pointer in response to receiving Rollback signal 306. In one embodiment, replay logic 304 comprises a circular counter (not shown). In one embodiment, replay logic 304 comprises read pointer (Rd Ptr) logic 408 which receives the signal from control logic 403 to generate read pointer 306 for first queue 401a of first EDS 401. In one embodiment, read pointer logic 408 comprises a circular counter (not shown).

In one embodiment, control logic 403 is a generic control logic which is used to update the read pointer for queue 401a. In one embodiment, control logic 403 includes states of its own which need to be rolled back along with the read pointers when a roll back request (indicated by Rollback signal 306) arrives. In one embodiment, Error signal from the compare unit 402d is provided, instead of Rollback signal 306 or in addition to Rollback signal 306, to control logic 403.

In one embodiment, replay logic 304 comprises control logic 404 to store current or present state of read and write pointers. In one embodiment, replay logic 304 comprises control logic 405 which saves the previous read and write pointers. In one embodiment, control logic 404 includes the latest state for the control logic 403 while control logic 405 denotes the prior states for control logic 403. In one embodiment, the number of old states retained is typically two. However, in other embodiments, other numbers (greater or less than two) of older states may be retained. In one embodiment, when Rollback signal 306 is received by control logic 402, control logic 403 copies the old states from control logic 405 to present state in control logic 404 and resumes execution from a previous time stamp.

In one embodiment, replay logic 304 comprises logic 406 to store previous state of read pointer. For example, logic 406 includes the read pointer values at an earlier time stamp (e.g., T−1, where 'T' is the current time). In one embodiment, replay logic 304 comprises logic 407 to store current or present state of read pointer. For example, logic 407 includes read pointer value for the current time stamp (e.g., 'T'). In one embodiment, the number of previous states (or old states) retained by logic 406 is two. In other embodiments, fewer or more than two previous states may be retained by logic 406.

In one embodiment, a back-up copy of control state elements (e.g., read and write pointers) of first queue 401a of first EDS 401 are maintained. This back-up copy allows restoration of first queue 401a to a previous state which is two clock cycles ago. In one embodiment, after the queue 401a rolls back to a previous state, the filing transmission is replayed until there are no timing failures in the second queue 402g of second EDS 402. In one embodiment, if timing failures continue to occur despite replaying of data from transmitting queue to receiving queue then power supply level for various circuits (or all circuits) involved in the first EDS 401, second EDS 402, and data-path 303 is raised from its previous level or operational frequency is reduced from its previous level.

In one embodiment, first and second queues (e.g., 401a and 402a) of first and second EDSs 401 and 402 comprise of positive or negative latches. The explanation provided here is for positive latches only, but a similar scheme can be implemented with negative latches as well. The embodiments combine error-detection and recovery circuits with dynamic adaptation to adapt to operating environment (e.g., power supply droops, temperature changes, etc.) to deliver robust silicon (i.e., silicon without or substantially zero timing failures).

Figure 5:
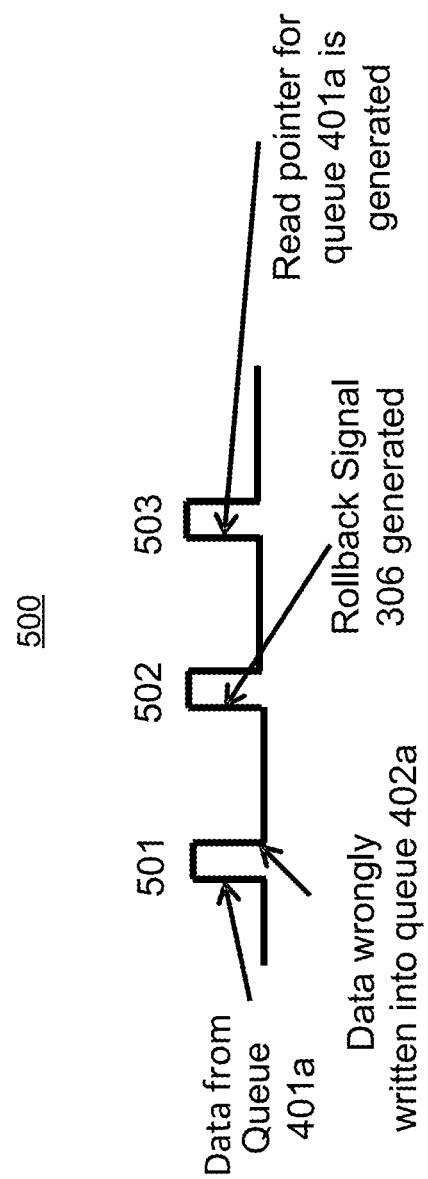
FIG. 5 illustrates a timing sequence, according to one embodiment of the disclosure.

FIG. 5 illustrates a timing sequence 500, according to one embodiment of the disclosure. It is pointed out that those elements of FIG. 5 having the same reference numbers (or names) as the elements of any other figure can operate or function in any manner similar to that described, but are not limited to such.

During the rising edge of first pulse 501 of clock signal CLK, data 305a is sampled by first queue 401a of first EDS 401. In this example, at the falling edge of first pulse 501, incorrect data is written into first queue 402a of second EDS 402. On the next rising edge (of second pulse 502) of clock signal CLK, Rollback signal 306 is generated. If there is data which is wrongly written into queue 402a, then Error signal is generated during the low-phase for the clock (CLK). On the third rising edge (of third pulse 503) of clock signal CLK, read pointer for the source queue (here, queue 401a) is restored to an older state (e.g., state at T−2, where 'T' is the current time).

Figure 6:
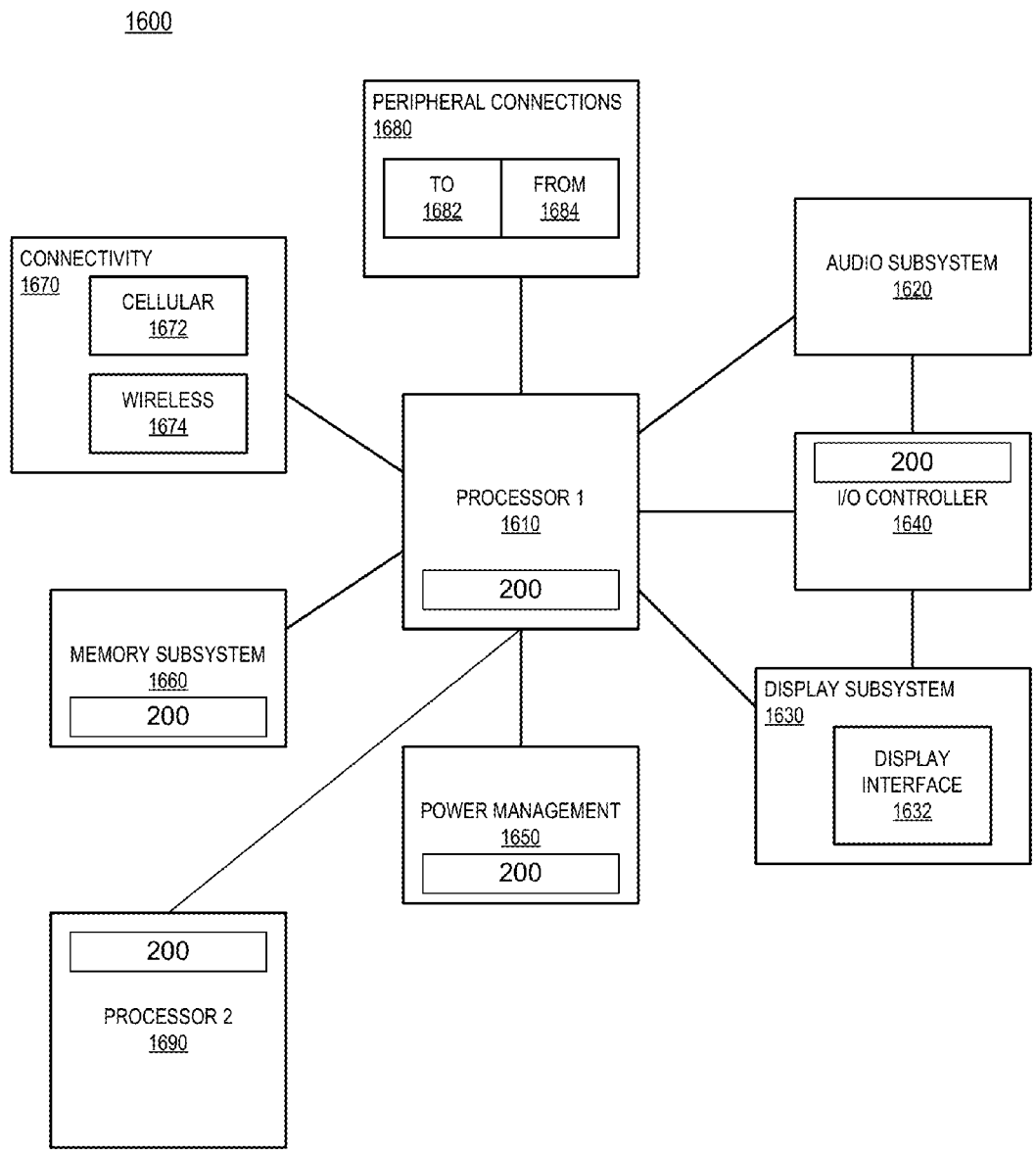
FIG. 6 is a smart device or a computer system or an SoC (system-on-chip) with queue embedded in parallel with the sampler, according to one embodiment of the disclosure.

FIG. 6 is a smart device or a computer system or a SoC (system-on-chip) with queue embedded in parallel with the sampler, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with EDS 200, according to the embodiments discussed. Other blocks of the computing device 1600 may also include EDS 200. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first error detection sequential (EDS) having a first first-in/ first-out (FIFO) queue coupled in parallel to a first sequential unit such that the first FIFO queue and first sequential unit of the first EDS receive a first input; a second EDS having a first FIFO queue coupled in parallel to a first sequential unit such that the first FIFO queue and first sequential unit of the second EDS receive a second input; and a data-path logic to receive output of the first EDS and to provide the second input to the second EDS.

In one embodiment, the second EDS comprises: a first compare unit to receive an output from the first sequential unit; and a first selection unit controllable by a write pointer of a previous cycle, the first selection unit to receive outputs of each storage unit of the first FIFO queue, and wherein the first selection unit to generate an output for comparison by the first compare unit to conditionally generate one or more error signals. In one embodiment, the second EDS comprises a second sequential unit to receive output of the first compare unit, the output of the second sequential unit is coupled to the first EDS. In one embodiment, the output of the second sequential unit to adjust read pointer of the first EDS.

In one embodiment, the second EDS comprises a second FIFO queue to receive output of the first compare unit. In one embodiment, the second EDS comprises a second selection unit to receive the outputs of each storage unit of the first FIFO queue, the second selection unit controllable by a read pointer. In one embodiment, the second EDS comprises a logic unit to receive output of the second selection unit and output of a storage unit of the second FIFO queue, the output of the storage unit of the second FIFO queue selected using the read pointer, the logic unit to generate an output of the second EDS.

In one embodiment, the first and second FIFO queues each comprise at least three storage units. In one embodiment, the first and second FIFO queues include one of: an SRAM cell; a flip-flop; or a latch. In one embodiment, the first sequential unit is operable to double sample the first input.

In another example, an apparatus comprises: a first sequential unit; a first queue coupled in parallel to the first sequential unit such that the first queue and first sequential unit receive a first input; a compare unit to receive an output from the first sequential unit; and a first selection unit controllable by a write pointer of a previous cycle, the first selection unit to receive outputs of each storage unit of the first queue, wherein the first selection unit to generate an output for comparison by the first compare unit.

In one embodiment, the apparatus further comprises: a second sequential unit to receive output of the compare unit, the output of the second sequential unit to generate a rollback signal for adjusting a read pointer for another queue or the first EDS. In one embodiment, the apparatus further comprises a read pointer logic to offset read operation of the first queue from write operation to the first queue by one or more clock cycles. In one embodiment, the apparatus further comprises a second queue to receive output of the compare unit. In one embodiment, the second queue is a 1-bit first-in/first-out (FIFO) queue to store error history. In one embodiment, the first and second queues are at least one of: first-in/first-out (FIFO); shift-register; or serial chain of SRAM cells.

In one embodiment, the apparatus further comprises: a second selection unit to receive the outputs of each storage unit of the first queue, the second selection unit controllable by a read pointer. In one embodiment, the apparatus further comprises: a logic unit to receive output of the second selection unit and output of a storage unit of the second queue, the output of the storage unit of the second queue selected using the read pointer, the logic unit to generate an output indicating validity of data read from the first queue.

In one embodiment, the first queue comprises at least three storage units. In one embodiment, the first sequential unit is operable to double sample the first input. In one embodiment, a system comprises: a wireless interface; a memory; and a processor coupled to the memory, wherein the wireless interface to allow the processor to communicate with another device, wherein the processor includes: a first error detection sequential (EDS) having a first queue coupled in parallel to a first sequential unit such that the first queue and first sequential unit of the first EDS receive a first input; a second EDS having a first queue coupled in parallel to a first sequential unit such that the first queue and first sequential unit of the second EDS receive a second input; and a data-path logic to receive output of the first EDS and to provide the second input to the second EDS.

In one embodiment, the second EDS comprises: a first compare unit to receive an output from the first sequential unit; a first selection unit controllable by a write pointer of a previous cycle, the first selection unit to receive outputs of each storage unit of the first queue, and wherein the first selection unit to generate an output for comparison by the first compare unit; and a second sequential unit to receive output of the first compare unit, the output of the second sequential unit is coupled to the first EDS.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An error detection arrangement comprising:
a first apparatus having a first first-in/first-out (FIFO) queue coupled in parallel to a first sequential unit such that a storage unit of the first FIFO queue and first sequential unit of the first apparatus receive a first input;
a second apparatus having a second FIFO queue coupled in parallel to a second sequential unit such that a storage unit of the second FIFO queue and second sequential unit of the second apparatus receive a second input, the second FIFO queue being operable to generate a second output corresponding to the second input; and
a data-path logic to receive the second output of the second apparatus and to provide the first input to the first apparatus,
wherein the second apparatus is operable to resend the second output based on contents of the first sequential unit and the storage unit of the first FIFO queue corresponding to the first input being different.

2. The arrangement of claim 1, wherein the first apparatus comprises:
a first selection unit to select the storage unit of the first FIFO queue corresponding to the first input; and
a first compare unit to compare contents of the first sequential unit and the storage unit selected by the first selection unit.

3. The arrangement of claim 2, wherein the first apparatus comprises:
a third sequential unit to receive output of the first compare unit, the output of the third sequential unit is coupled to the second apparatus.

4. The arrangement of claim 3, wherein the output of the third sequential unit to adjust read pointer of the second apparatus.

5. The arrangement of claim 2, wherein the first apparatus comprises:

a third FIFO queue to receive output of the first compare unit.

6. The arrangement of claim 5, wherein the first apparatus comprises:
a second selection unit to receive the outputs of each storage unit of the first FIFO queue, the second selection unit controllable by a read pointer.

7. The arrangement of claim 6, wherein the first apparatus comprises:
a logic unit to receive output of the second selection unit and output of a storage unit of the third FIFO queue, the output of the storage unit of the third FIFO queue selected using the read pointer, the logic unit to generate an output of the first apparatus.

8. The arrangement of claim 1, wherein the first and second FIFO queues each comprise at least three storage units.

9. The arrangement of claim 1, wherein the first and second FIFO queues include one of:
an SRAM cell;
a flip-flop; or
a latch.

10. The arrangement of claim 1, wherein the first sequential unit is operable to double sample the first input.

11. A system comprising:
a memory;
a processor coupled to the memory, the processor including;
a first apparatus having a first queue coupled in parallel to a first sequential unit such that a storage unit of the first queue and first sequential unit of the first apparatus receive a first input;
a second apparatus having a second queue coupled in parallel to a second sequential unit such that a storage unit of the second queue and second sequential unit of the second apparatus receive a second input, the second queue being operable to generate a second output corresponding to the second input; and
a data-path logic to receive the second output of the second apparatus and to provide the first input to the first apparatus, wherein the second apparatus is operable to resend the second output based on contents of the first sequential unit and the storage unit of the first queue corresponding to the first input being different; and
a wireless interface to allow the processor to communicate with another device.

12. The system of claim 11, wherein the first apparatus comprises:
a first selection unit to select the storage unit of the first queue corresponding to the first input;
a first compare unit to compare contents of the first sequential unit and the storage unit selected by the first selection unit;
and
a third sequential unit to receive output of the first compare unit, the output of the third sequential unit is coupled to the second apparatus.

* * * * *